United States Patent [19]

Garcia et al.

[11] Patent Number: 4,510,607
[45] Date of Patent: Apr. 9, 1985

[54] SEMICONDUCTOR LASER END-FACET COATINGS FOR USE IN SOLID OR LIQUID ENVIRONMENTS

[75] Inventors: Graham A. Garcia; Steven J. Cowen, both of San Diego, Calif.

[73] Assignee: The United States of America as represented by the Secretary of the Navy, Washington, D.C.

[21] Appl. No.: 567,594

[22] Filed: Jan. 3, 1984

[51] Int. Cl.³ .............................................. H01S 3/18
[52] U.S. Cl. ...................................... 372/49; 427/82; 427/162
[58] Field of Search ..................... 427/82, 162; 372/49

[56] References Cited

U.S. PATENT DOCUMENTS

| | | | |
|---|---|---|---|
| 3,943,462 | 3/1976 | Thompson | 372/49 |
| 4,092,659 | 5/1978 | Ettenberg | 372/49 |
| 4,317,086 | 2/1982 | Scifres | 372/49 |
| 4,337,443 | 6/1982 | Umeda | 372/49 |

OTHER PUBLICATIONS

Ettenberg, "A New Dielectric Facet Reflector for Semiconductor Lasers", Appl. Phys. Lett. 32(11), Jun. 1, 1978, p. 724.

*Primary Examiner*—John D. Smith
*Attorney, Agent, or Firm*—Robert F. Beers; Ervin F. Johnston; Thomas Glenn Keough

[57] ABSTRACT

An improvement for a semiconductor laser allows the facet reflectivity to be modified to compensate for the presence of a liquid or transparent solid medium having an index of refraction $n_m$. A first dielectric coating is disposed on an end-facet of the semiconductor laser and has an index of refraction $n_1$. A second dielectric coating is disposed on the first dielectric coating and has an index of refraction $n_2$. The materials of the dielectric coatings are selected such that the fraction $n_1/n_2 = \sqrt{n_m}$. Thus the problems associated with reductions of laser facet reflectivity due to being in contact with a surrounding medium which optically is very different from air is overcome.

4 Claims, 1 Drawing Figure

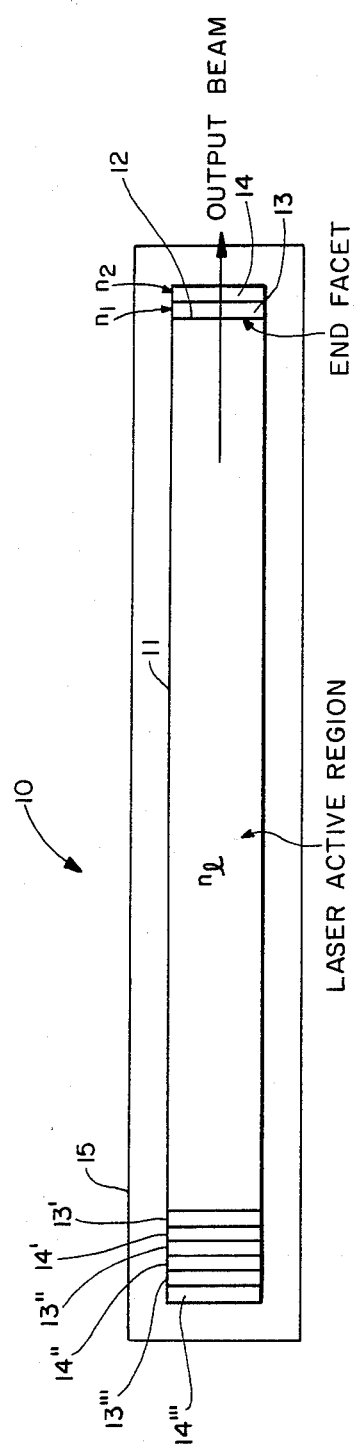

SEMICONDUCTOR LASER END-FACET COATINGS FOR USE IN SOLID OR LIQUID ENVIRONMENTS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Conventional semiconductor lasers rely upon the refractive index difference between the active layer of the material and the surrounding medium to provide an end-facet reflectivity which is high enough to sustain normal laser oscillation. Typically, the active layer material has an index of refraction of n=3.6 while the surrounding medium, usually air, has an index of refraction of 1.0. For most applications the differences between the refractive indexes has been sufficient to sustain the normal laser oscillation; however, the wide variety of uses that laser technology is expanding into have necessitated that a modification be made which enables satisfactory operation through different mediums.

Certain packaging constraints may require that the layer be immersed in a liquid or potted in a solid material. This would be the case where the laser needs protection from ambient influences or for ruggedization. Another application would be the immersion of the laser for underwater communications or a scientific application that places the end-facet in direct contact with the water transmitting medium. The water, dielectric oil or transparent potting materials usually have a relatively high refractive index, n, in the neighborhood of about 1.3. When conventional semiconductor lasers are so used, the end-facet reflectivity is decreased to a level which seriously alters the characteristics of the laser. The reduced facet reflectivity results in an increased threshold current, higher intensity noise and modal instability.

A few contemporary semiconductor laser designs have their end-facets coated with protective layers of aluminum oxide and silicon dioxide. In some lasers the coatings serve primarily to protect the end-facets from damage due to chemical attack. These protective coatings are typically an odd integral multiple of half-wavelength in thickness and therefore have no effect on the facet reflectivity which is determined solely by the refractive indexes of the active region and the surrounding medium.

The Multiple-Layer Reflector for Electroluminiscent Device by Michael Ettenberg in U.S. Pat. No. 4,092,659 concerns a reflector arrangement for optical radiation made of aluminum oxide, magnesium fluoride and silicon dioxide layers. The reflectivity of the layers on gallium arsenide and aluminum gallium arsenide materials of a semiconductor laser are variable to effect a desired percentage of reflectivity from nearly total reflectivity to a nearly minimal reflectivity. Ettenberg's modified device is said to have excellent reflecting properties and resistance to chemical attack during fabrication processing.

Applying layers of high index material across the facet surface of a semiconductor electroluminescent device was the subject matter of the U.S. Pat. No. 4,317,086 to Donald R. Scifres et al. Differing levels of reflectivity were provided for, it being found that a three layer reflector offered a relatively high modal reflectivity.

Thus, there is a continuing need in the state-of-the-art for an improvement for a semiconductor laser that modifies the end-facets to accommodate the presence of the liquid or solid immersion medium to restore the facet reflectivity to a more favorable level to sustain normal laser oscillation.

SUMMARY OF THE INVENTION

The present invention is directed to providing an apparatus for improving the transmission characteristics of a semiconductor laser in a liquid or transparent solid medium having an index of refraction $n_m$. A first dielectric coating is disposed on an end facet of the semiconductor of the laser and has an index of refraction $n_1$. A second dielectric coating is applied to the first dielectric coating and has an index of refraction $n_2$. The materials of the dielectric coatings are selected such that $n_1/n_2 = \sqrt{n_m}$ to permit the semiconductor laser to sustain normal laser oscillation in the liquid or transparent solid medium.

The prime object of the invention is to provide an improvement for a semiconductor laser.

Another object of the invention is to provide an improvement for a semiconductor laser which enables it to favorably operate in mediums other than air.

Yet another object of the invention is to provide a semiconductor laser having a first and second dielectric laser coating to enable satisfactory operation in a liquid or solid transparent medium.

Still another object of the invention is to provide an improvement for a semiconductor laser in which the index of refraction of the first dielectric coating $n_1$ and the index of refraction of a second dielectric coating $n_2$ satisfies the relationship of $n_1/n_2 = \sqrt{n_m}$ where $n_m$ is the index of refraction of the transmitting medium.

Yet a further object of the invention is to provide an improvement for a semiconductor laser having a first dielectric coating of magnesium fluoride covered by a second dielectric coating of aluminum oxide to assure satisfactory transmission of optical energy through a water medium.

A further object is to provide a ruggedized semiconductor laser encased in an optically transparent potting compound due to the inclusion of a layer of magnesium fluoride covered by a layer of aluminum oxide on the end-facet of the semiconductor laser.

Still another object is to provide at least one even numbered layered laminate of dielectrics on an end-facet each having a one-quarter wavelength thickness.

Other objects, advantages and novel features of the invention will become more readily apparent from the following detailed description of the invention when considered in conjunction with the claims and accompanying drawings.

BRIEF DESCRIPTION OF THE DRAWINGS

The FIGURE depicts a representation of a semiconductor laser having dielectric coatings disposed on end-facets to restore the facet reflectivity to a more favorable level of operation through mediums other than air.

DESCRIPTION OF THE PREFERRED EMBODIMENT

In the absence of end-facet coatings, the facet reflectivity is given by $$R = \left[\frac{n_l - n_m}{n_l + n_m}\right]^2$$

where $n_l$ and $n_m$ are the refractive indexes of the lasser active region and the surrounding medium, respectively. This expression is also valid for facets coated with half wavelength protective layers. For an ambient, $n_m = 1.0$ and the facet reflectivity given by the expression above is approximately 32% for a GaAlAs semiconductor laser whose active region has a refractive index of 3.6. Immersion in a liquid medium such as mineral oil ($n_m = 1.48$) or an epoxy potting material ($n_m = 1.50$) will reduce the facet reflectivity to about 17%. The reflectivity of the facet, in a given ambient medium, can be modified by applying layers of dielectric material in carefully controlled thicknesses to the facet surfaces. These layers provide additional reflected components which may add destructively or constructively with each other to result in an effective reflectivity which may be varied over a wide range. For a given ambient medium, the effective reflectivity for light incident on the facet surface can be adjusted from 0 to 100% by choosing the appropriate number of applied layers with refractive indexes and thicknesses selected to give the correct amplitude and phase relationships amongst the reflected wavefronts. In the application mentioned here, the dielectric coating is designed to compensate for the presence of a surrounding liquid or solid medium; the intervening dielectric layers restore the facet reflectivity to the original, air-ambient level.

An implementation of these ideas is shown in the FIGURE of the drawings. A typical semiconductor laser 10 has its active element 11 oriented to project coherent light through an end-facet 12.

Dielectric coatings 13 and 14 are applied at the right side of end-facet 12 and at the left side of the active element a series of dielectric coatings 13', 14', 13'', 14'', 13''' and 14''' are disposed to provide for a selective reflectivity.

The series of dielectric layers to the left of the active element are to assure a desired level of reflectivity that can vary from nearly zero to over ninety percent. The material of the layers is alternating layers of magnesium fluoride and aluminum oxide.

The two layers 13 and 14 also are layers of magnesium fluoride and aluminum oxide, however the two layers are to permit an adjustment of the indexes of refraction to allow a coupling of the output beam to the higher refractive index medium 15.

The higher refractive index mediums referred to are dielectric oil, a potting epoxy or the like, which have refractive indexes of about 1.5. These mediums are used to encapsulate the active element when pressure compensation is needed when the laser is to be in the water, for example, or when corrosive influences may be present.

The dielectric oil or potting compound may be immersed in a water medium and the active element is not exposed to corrosive or performance compromising influences. Undersea communications, alignments or homing signals can be reliably established without undue constraints on reliability.

To each laser end-facet are applied successive ¼ wavelength thick layers of the two dielectric materials whose refractive indexes alternate between $n_1$ and $n_2$. For transmission at one micron, therefore, a layer of 0.25 microns is appropriate.

For a total of k such layers (k: an *even* integer) the reflectivity can be shown to be given by $$R^1 = \left[\frac{n_l\left(\frac{n_2}{n_1}\right)^{k/2} - n_m\left(\frac{n_1}{n_2}\right)^{k/2}}{n_l\left(\frac{n_2}{n_1}\right)^{k/2} + n_m\left(\frac{n_1}{n_2}\right)^{k/2}}\right]^2$$

where $n_1$ is the index of the layer nearest the laser facet. This expression resembles the expression for the reflectivity of the uncoated facets with the exception that the factors $(n_2/n_2)^{k/2}$ and $(n_1/n_2)^{k/2}$ appear in conjunction with $n_l$ and $n_m$, respectively. By choosing $n_2 > n_1$, one may increase the facet reflectivity over a wide range.

For most applications, a simple two layer per facet (k=2) coating would be adequate to completely compensate for the effects of a liquid or solid immersion medium. For this case, choosing $n_2/n_1 = \sqrt{n_m}$ will exactly compensate for the presence of a surrounding medium with an index $n_m$; the laser sees the same facet reflectivity in this medium as it would in an air environment without the dielectric coatings.

Obviously many modifications and variations of the present invention are possible in the light of the above teachings. It is therefore to be understood that within the scope of the appended claims the invention may be practiced otherwise than as specifically described.

What is claimed is:

1. An improved semiconductor laser having improved transmission characteristics when transmitting in a liquid or a transparent solid medium having an index of refraction $n_m$ comprising:
   a first dielectric coating disposed on an end-facet of the semiconductor laser having an index of refraction $n_1$; and
   a second dielectric coating disposed on the first dielectric coating having an index of refraction $n_2$, the materials of the dielectric coatings are selected such that $n_1/n_2 = n_m$.

2. An apparatus according to claim 1 in which the material of the first dielectric coating is magnesium fluoride and the material of the second dielectric coating is aluminum oxide.

3. An apparatus according to claim 2 in which the first dielectric coating and the second dielectric coating are applied to a thickness of one-quarter wavelength.

4. A method of improving the transmission characteristics of a semiconductor laser in a liquid or transparent solid medium having a refractive index of $n_m$ comprising:
   disposing a first dielectric coating on an end-facet of the semiconductor laser having an index of refraction $n_1$; and
   disposing a second dielectric coating on the first dielectric coating having an index of refraction $n_2$, the materials of the dielectric coatings are selected such that $n_1/n_2 = \sqrt{n_m}$.

* * * * *